United States Patent
Wang et al.

(10) Patent No.: US 6,570,787 B1
(45) Date of Patent: May 27, 2003

(54) PROGRAMMING WITH FLOATING SOURCE FOR LOW POWER, LOW LEAKAGE AND HIGH DENSITY FLASH MEMORY DEVICES

(75) Inventors: Zhigang Wang, Santa Clara, CA (US); Nian Yang, San Jose, CA (US); Xin Guo, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/126,330

(22) Filed: Apr. 19, 2002

(51) Int. Cl.⁷ .............................................. G11C 16/04
(52) U.S. Cl. ............................. 365/185.17; 365/185.18; 365/185.33
(58) Field of Search ...................... 365/185.17, 185.18, 365/185.33, 185.29, 218, 185.05

(56) References Cited

U.S. PATENT DOCUMENTS

| | | |
|---|---|---|
| 5,945,717 A | 8/1999 | Chevallier |
| 6,153,469 A | 11/2000 | Yun et al. |
| 6,449,188 B1 * | 9/2002 | Fastow .................. 365/185.18 |
| 2001/0043490 A1 | 11/2001 | Mihnea et al. |

* cited by examiner

*Primary Examiner*—David Lam
(74) *Attorney, Agent, or Firm*—Eschweiler & Associates, LLC

(57) ABSTRACT

The present invention relates to a flash memory array architecture comprising a plurality of flash memory cells arranged in a NOR type array configuration. Each of the plurality of flash memory cells have a source terminal coupled together to form a common source. The array architecture further comprises a common source selection component coupled between the common source of the array and a predetermined potential. The common source selection component is operable to couple the common source to the predetermined potential in a first state and electrically isolate or float the common source from the predetermined potential in a second state, thereby reducing leakage of non-selected cells associated with the activated bit line during a program mode of operation.

33 Claims, 5 Drawing Sheets

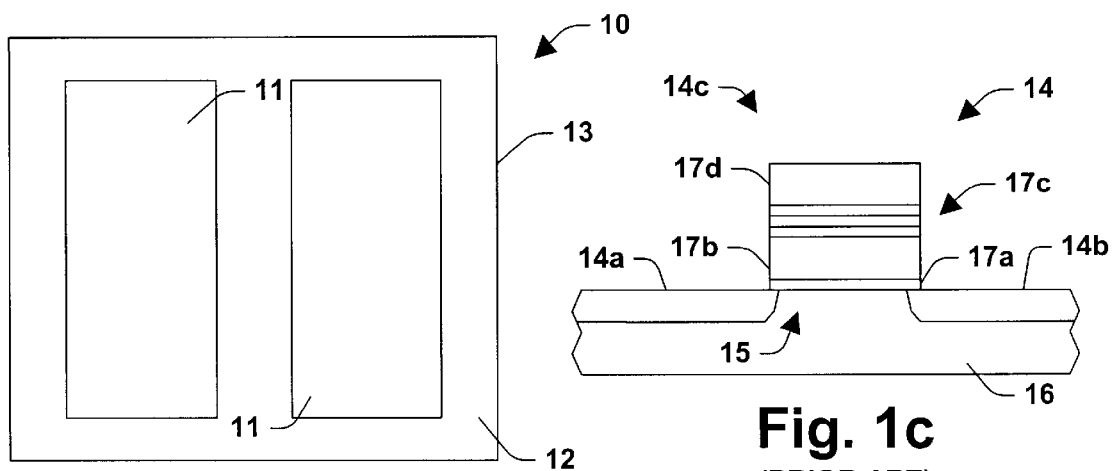
Fig. 1a
(PRIOR ART)
Fig. 1c
(PRIOR ART)
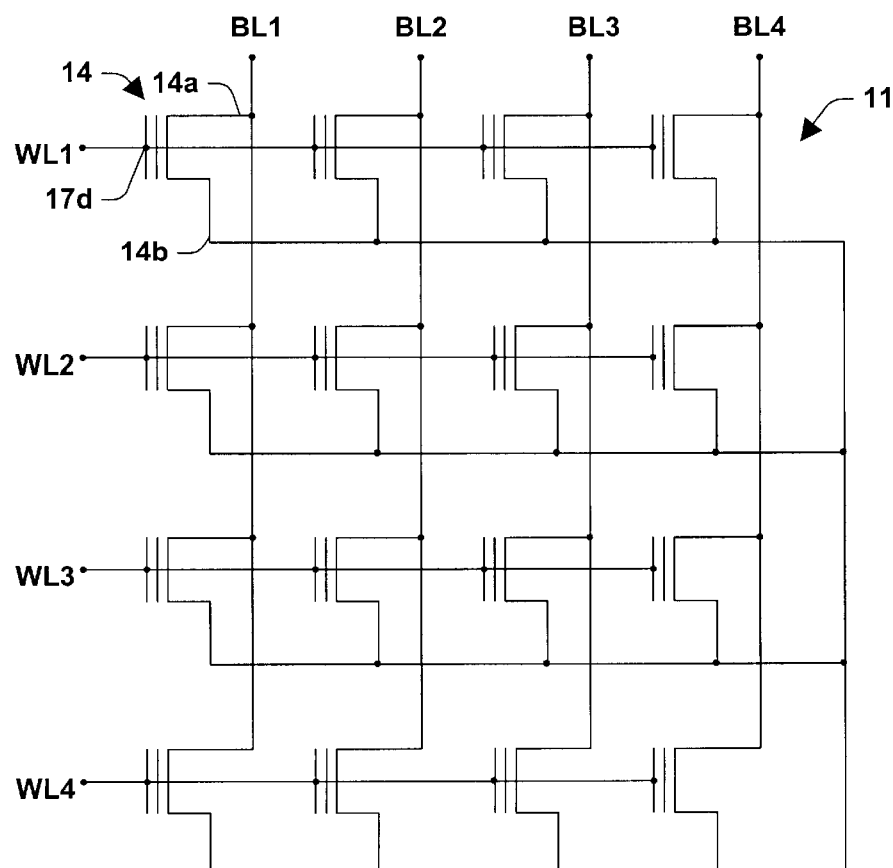
Fig. 1b
(PRIOR ART)

PROGRAMMING WITH FLOATING SOURCE FOR LOW POWER, LOW LEAKAGE AND HIGH DENSITY FLASH MEMORY DEVICES

FIELD OF THE INVENTION

The present invention generally relates to floating gate memory devices such as an array of flash memory cells, and relates more particularly to a circuit architecture and method for programming NOR flash arrays to reduce column leakage associated therewith.

BACKGROUND OF THE INVENTION

As is generally known, in recent years a new category of electrically erasable EPROMs/EEPROMs has emerged as an important non-volatile memory which combines the advantages of EPROM density with EEPROM electrical erasability and are sometimes referred to as "flash" EPROM or EEPROM. Flash memory devices typically include multiple individual components formed on or within a substrate. Such devices often comprise a high density section and a low density section. For example, as illustrated in prior art FIG. 1a, a memory device such as a flash memory 10 comprises one or more high density core regions 11 and a low density peripheral portion 12 on a single substrate 13. The high density core regions 11 typically consist of at least one M×N array of individually addressable, substantially identical floating-gate type memory cells and the low density peripheral portion 12 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the core portion 11 are coupled together in a NOR-type circuit configuration, such as, for example, the configuration illustrated in prior art FIG. 1b. Each memory cell 14 has a drain 14a, a source 14b and a stacked gate 14c.

The NOR configuration illustrated in FIG. 1b has each drain terminal 14a of the transistors within a single column connected to the same bit line (BL). In addition, each flash cell 14 has its stacked gate terminal 14c coupled to a different word line (WL) while all the flash cells in the array have their source terminals 14b coupled to a common source terminal (CS). In operation, individual flash cells may be individually addressed via the respective bit line and word line using peripheral decoder and control circuitry for programming (writing), reading or erasing functions.

Prior art FIG. 1c represents a fragmentary cross section diagram of a typical memory cell 14 in the core region 11 of prior art FIGS. 1a and 1b. Such a cell 14 typically includes the source 14b, the drain 14a, and a channel 15 in a substrate or P-well 16; and the stacked gate structure 14c overlying the channel 15. The stacked gate 14c further includes a thin gate dielectric layer 17a (commonly referred to as the tunnel oxide) formed on the surface of the P-well 16. The stacked gate 14c also includes a polysilicon floating gate 17b which overlies the tunnel oxide 17a and an interpoly dielectric layer 17c overlies the floating gate 17b. The interpoly dielectric layer 17c is often a multilayer insulator such as an oxide-nitride-oxide (ONO) layer having two oxide layers sandwiching a nitride layer. Lastly, a polysilicon control gate 17d overlies the interpoly dielectric layer 17c. The control gates 17d of the respective cells 14 that are formed in a lateral row share a common word line (WL) associated with the row of cells (see, e.g., prior art FIG. 1b). In addition, as highlighted above, the drain regions 14a of the respective cells in a vertical column are connected together by a conductive bit line (BL). The channel 15 of the cell 14 conducts current between the source 14b and the drain 14a in accordance with an electric field developed in the channel 15 by the stacked gate structure 14c.

According to conventional operation, the flash memory cell 14 operates in the following manner. The cell 14 is programmed by applying a relatively high voltage $V_G$ (e.g., approximately 9 volts) to the control gate 17d and connecting the source to ground and the drain 14a to a predetermined potential above the source 14b (e.g., approximately 5 volts). These voltages generate a vertical and lateral electric field along the length of the channel from the source to the drain. This electric field causes electrons to be drawn off the source and begin accelerating toward the drain. As they move along the length of the channel, they gain energy. If they gain enough energy, they are able to jump over the potential barrier of the oxide into the floating gate 17b and become trapped in the floating gate 17b since the floating gate 17b is surrounded by insulators (the interpoly dielectric 17c and the tunnel oxide 17a). As a result of the trapped electrons, the threshold voltage of the cell 14 increases, for example, by about 2 to 5 volts. This change in the threshold voltage (and thereby the channel conductance) of the cell 14 created by the trapped electrons is what causes the cell to be programmed.

To read the memory cell 14, a predetermined voltage $V_G$ that is greater than the threshold voltage of an unprogrammed or erased cell, but less than the threshold voltage of a programmed cell, is applied to the control gate 17d with a voltage applied between the source 14b and the drain 14a (e.g., tying the source 14b to ground and applying about 1–2 volts to the drain 14a). If the cell 14 conducts (e.g., about 50–100 $\mu A$), then the cell 14 has not been programmed (the cell 14 is therefore at a first logic state, e.g., a zero "0"). Likewise, if the cell 14 does not conduct (e.g., considerably less current than 50–100 $\mu A$), then the cell 14 has been programmed (the cell 14 is therefore at a second logic state, e.g., a one "1"). Consequently, one can read each cell 14 to determine whether it has been programmed (and therefore identify its logic state).

A flash memory cell 14 can be erased in a number of ways. In one arrangement, a relatively high voltage Vs (e.g., approximately 12–20 volts) is applied to the source 14b and the control gate 17d is held at a ground potential ($V_G=0$), while the drain 14a is allowed to float. Under these conditions, a strong electric field is developed across the tunnel oxide 17a between the floating gate 17b and the source 14b. The electrons that are trapped in the floating gate undergo Fowler-Nordheim tunneling through the tunnel oxide 17a to the source 14b. In another arrangement, applying a negative voltage on the order of minus 10 volts to the control gate, applying 5 volts to the source and allowing the drain to float can also erase a cell. In a further arrangement, applying 5 volts to the P-well and minus 10 volts to the control gate while allowing the source and drain to float erases a cell.

As flash memory cells continue to be scaled down in size, the short channel effects of the memory cells may cause some cells to exhibit scaling induced leakage. For example, as illustrated in FIG. 2, when a program function is to be performed for a cell in the NOR array 11, for example, the flash memory cell 14, other cells 22, 24 and 26 associated with the same bit line BL1 have a bit line voltage of about 5V applied to their drain terminal. Thus the electric field across the channel of cells 22, 24 and 26 can, in some instances, generate hot carriers which contribute to leakage current ($I_L \neq 0$) on the bit line, and is sometimes referred to as column leakage.

Such leakage during programming is undesirable because it negatively impacts the program efficiency of the memory device. That is, due to the leakage of unselected cells along a given bit line, the drain charge pump which supplies the current for the programming of the cell 14 also provides the extra current associated with the leakage of the other cells (e.g., cell 22 as illustrated in prior art FIG. 3). Thus the flash memory consumes extra power during programming which is not utilized. Since flash memory devices are often used in portable applications such as cell phones and personal digital assistants (PDAs) which use batteries as power sources, such reductions in program efficiency are particularly undesirable. The issue of column leakage is significant because in many arrays or device sectors 512 flash cells are associated with each bit line (BL). Thus if each or many of the 511 non-selected cells in the bit line are exhibiting scaling induced leakage during programming, power dissipation may become significant.

There is a strong need in the art for a flash memory device structure, architecture and process for manufacture that improves the performance and reliability of the device.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later. The present invention relates to a circuit architecture and method of programming data in a flash memory in which column leakage associated therewith is greatly reduced or eliminated altogether.

According to one aspect of the present invention, a flash memory device having improved programming efficiency is disclosed. The device comprises a plurality of flash memory cells configured to form a NOR-type array architecture, wherein each of the plurality of memory cells have a source terminal which are coupled together to form a common source. The device further comprises a common source selection component (e.g., a transistor) which is coupled between the common source and a predetermined potential (e.g., Vss or circuit ground potential). The common source selection component is operable to electrically isolate the common source from the predetermined potential during a program mode of operation, thereby causing the common source to float. Isolating the common source during programming prevents flash memory cells associated with a bit line having the selected memory cell from experiencing short channel induced leakage, thereby improving the programming efficiency.

When the common source is floated during programming, the shared common source capacitance of the NOR-array causes the source of the selected cell to behave, for example, as a virtual ground for a period of time. During such time period, application of a programming voltage to the word line associated with the selected cell causes the selected cell to be programmed. With regard to the other cells coupled to the same bit line as the selected cell, hot carrier induced leakage is prevented or substantially reduced due to the increased impedance associated with the floating common source. Therefore the drain pump employed to provide current along the bit line of the selected cell provides programming current for the selected cell to be programmed, but not for leaky, non-selected cells associated with the activated bit line. Consequently, the amount of current supplied by the drain pump (and thus power consumption) during programming is reduced, thereby improving the programming efficiency.

According to another aspect of the invention, the memory device comprises a common source control circuit which is adapted to ascertain an operational mode of the device and configure the common source selection component in response thereto in order to float the common source of the NOR array during a program mode of operation. For example, the common source control circuit receives one or more input signals which are indicative of an operational mode of the device such as the program mode, read mode and erase mode. The common source control circuit then outputs a control signal to the common source selection component to electrically isolate the common source of the NOR array from a predetermined potential during the program mode.

According to yet another aspect of the invention, a method of programming a flash memory cell in a NOR type memory array comprises identifying a program mode of operation and floating the common source of the NOR array containing the selected cell during a program mode of operation. After floating the common source, the selected cell is programmed, thereby reducing hot carrier induced leakage current associated with non-selected cells on the same bit line as the programmed cell.

According to still another aspect of the present invention, the method of programming comprises determining an operational mode of the flash memory device and identifying a flash memory cell within the array as a selected cell for programming if the operational mode is determined to be the program mode. The method further comprises activating a bit line associated with the selected cell and activating a word line associated with the selected cell with a programming voltage after the common source is floated, thereby programming the cell. By ensuring that the common source is floated prior to coupling the programming voltage to the appropriate word line, hot carrier induced leakage associated with non-selected cells on the activated bit line is reduced or eliminated altogether.

To the accomplishment of the foregoing and related ends, the invention comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1*a* is a plan view of a conventional flash memory device illustrating core regions and peripheral regions, respectively;

FIG. 1*b* is a schematic diagram illustrating a conventional NOR-type flash memory circuit architecture;

FIG. 1*c* is a cross section diagram illustrating a conventional stacked gate flash memory cell;

DETAILED DESCRIPTION OF THE INVENTION

Figure 2:
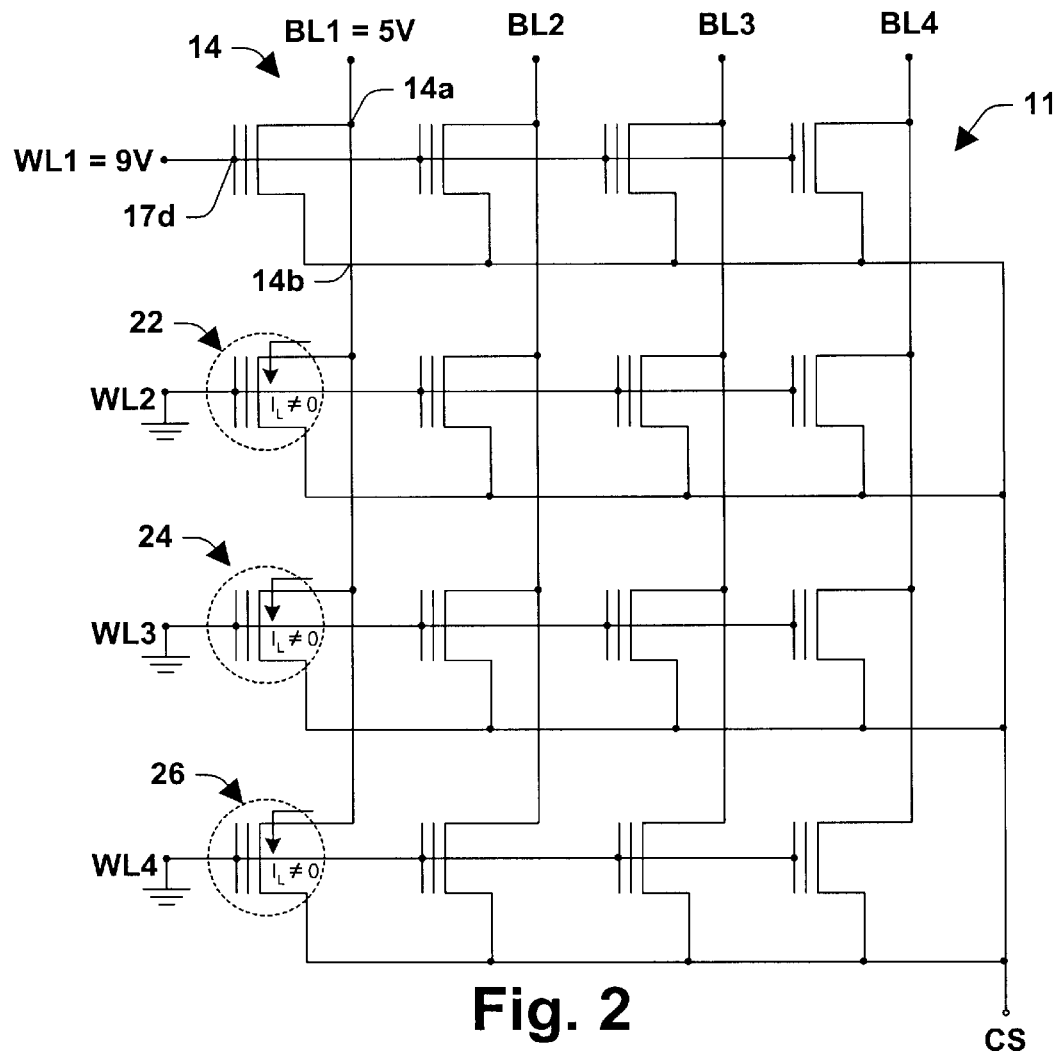
FIG. 2 is a schematic diagram illustrating a conventional NOR-type flash memory circuit architecture and how hot carrier induced leakage can reduce programming efficiency therein.
Figure 3:
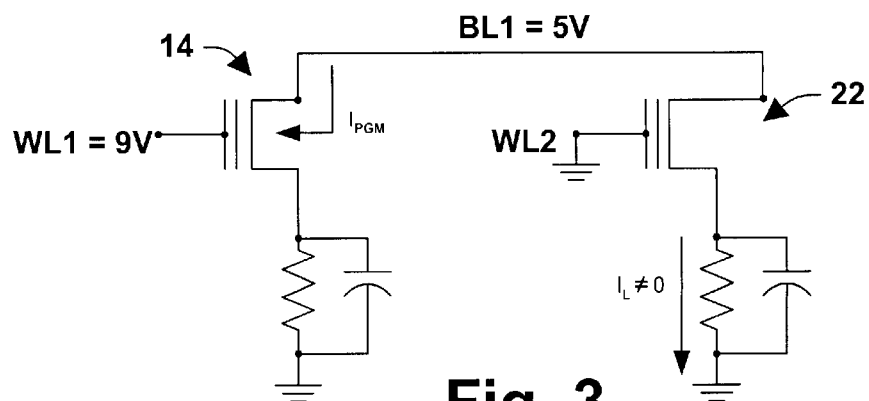
FIG. 3 is a schematic diagram illustrating a leakage current path for a non-selected cell on an activated bit line during a programming operation in a conventional NOR-type flash memory array.

The present invention will now be described with reference to the drawings, wherein like reference numerals are used to refer to like elements throughout. The present invention provides a circuit architecture and a method of operation associated with a NOR-type flash memory circuit in which programming efficiency is increased by decreasing hot carrier induced leakage associated with non-selected memory cells on an activated bit line during programming. The leakage is reduced or eliminated altogether by floating the common source of the NOR array prior to programming, thereby removing the leakage path for non-selected cells. The selected memory cell for programming is programmed by applying a programming voltage to its respective word line and using the common source capacitance as a virtual ground to effectuate programming thereof. Details and further aspects of the present invention are provided below in greater detail.

Figure 4:
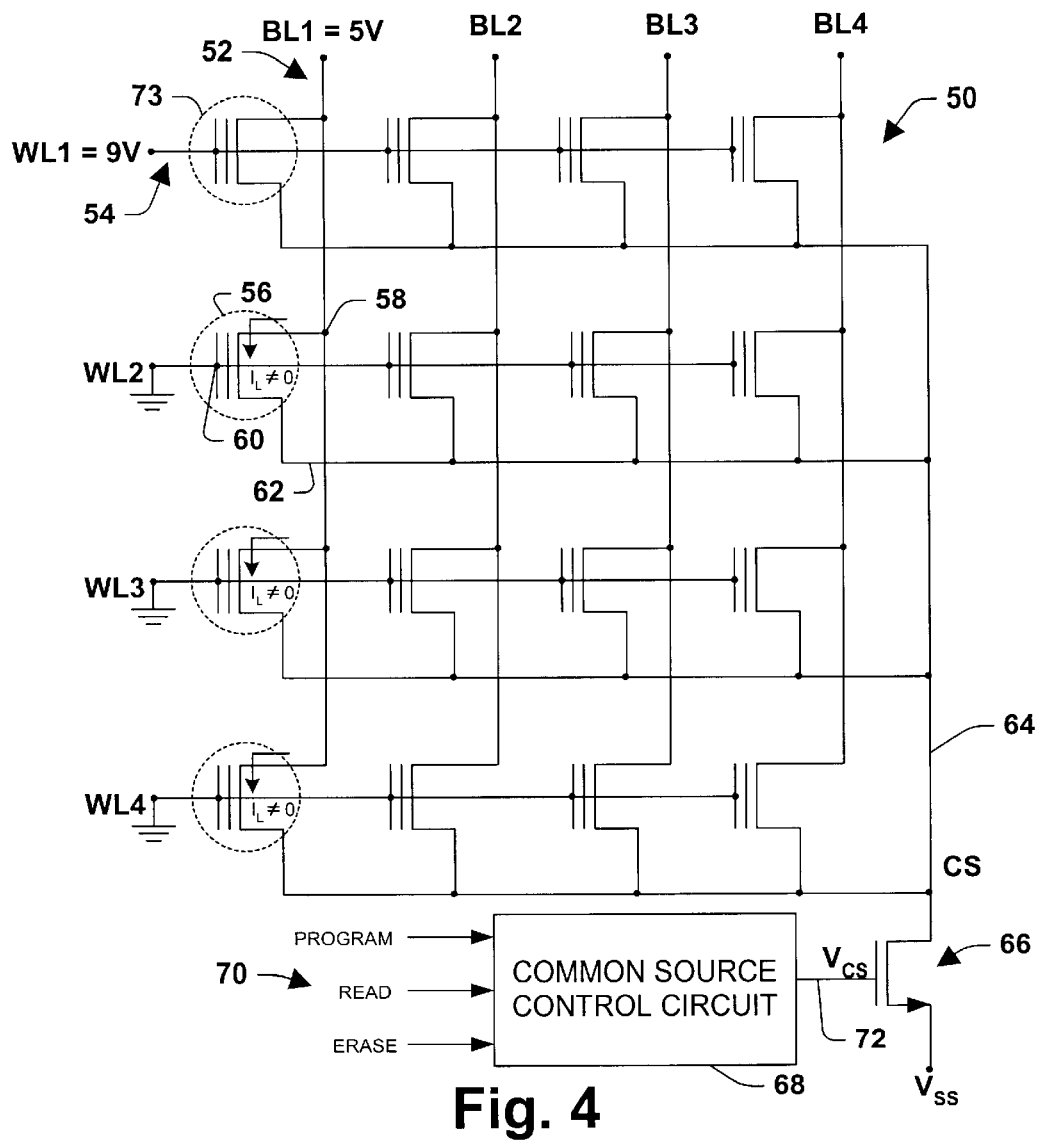
FIG. 4 is a schematic diagram illustrating a NOR-type flash memory array having a common source which is operable to float during a program mode of operation in accordance with one aspect of the present invention.

Turning now to FIG. 4, a schematic diagram of a portion of a flash memory device 50 according to one exemplary aspect of the present invention is illustrated. The flash memory device 50 has at least one NOR type array portion wherein the array is arranged in rows and columns corresponding to bit lines 52 and word lines 54, respectively. As illustrated in the example of FIG. 4, each of the flash memory cells 56 along a given bit line 52 have a drain terminal 58 coupled thereto, while each of the cells 56 along a given word line have a control gate 60 coupled thereto, respectively. In addition, each of the memory cells 56 in the array portion (e.g., a memory sector) have a source terminal 62 which are coupled together to form a common source 64 which is coupled to a predetermined potential (e.g., Vss or a circuit ground potential) through a common source selection component 66, which in this example comprises an NMOS transistor.

The common source selection component 66 of FIG. 4 is controlled by a common source control circuit 68 which receives one or more input signals 70, and outputs a control signal 72 ($V_{cs}$) in response thereto to activate or deactivate the common source selection component 66 accordingly. Therefore, based on a status or state of the inputs signal(s) 70, the common source control circuit 68 outputs the control signal 72 which is operable to activate or deactivate the common source selection component 66. Accordingly, the component 66 is operable to couple the common source 64 to the predetermined potential in one case, and electrically isolate (or float) the common source 64 in another.

Figure 5:
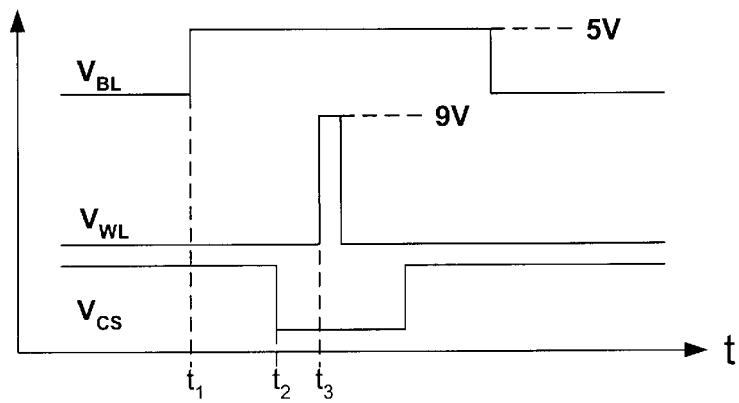
FIG. 5 is a timing diagram illustrating an exemplary control sequence such that the common source of the NOR array containing the selected memory cell is floating prior to the application of a programming pulse thereto according to another aspect of the present invention.
Figure 6:
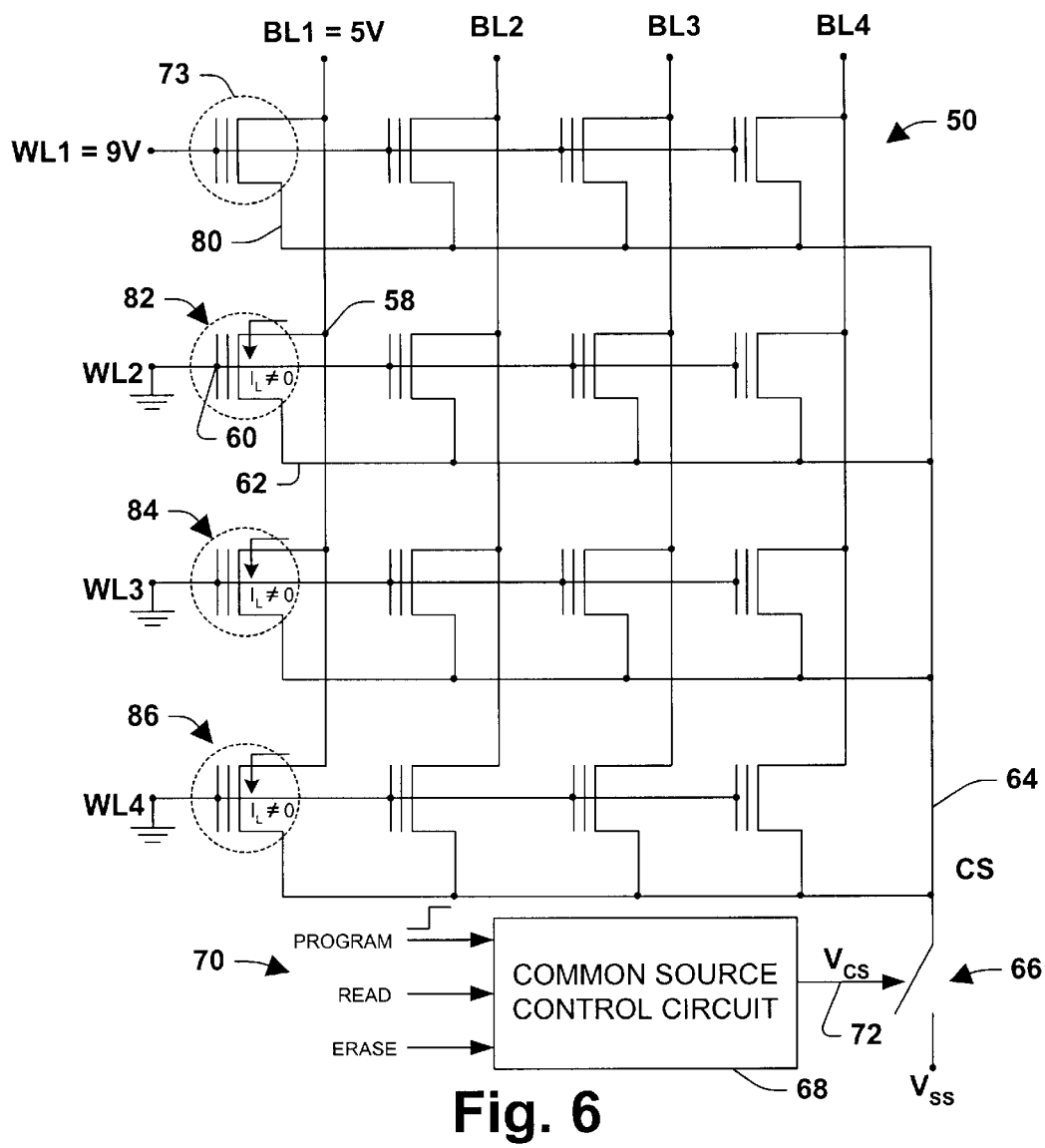
FIG. 6 is a schematic diagram illustrating the NOR-type flash memory array of FIG. 4 having the common source electrically isolated from the predetermined potential in accordance with the present invention.

In operation, the flash memory device 50 of the present invention is operable to float the common source 64 of the NOR array portion during programming of a selected memory cell 73 therein to reduce hot carrier induced leakage current in the array. For example, when the input signal(s) 70 indicate that a program mode of operation is to be performed (e.g., by asserting the PROGRAM signal), a program operation sequence is initiated similar to that illustrated in FIG. 5. For example, if the program operation sequence is initiated at time ($t_0$), the bit line associated with the selected memory cell (e.g., BL1 of FIG. 4) is activated at a time $t_1$, causing the voltage thereon to increase to a programming level (e.g., about 5V), causing each of the drain terminals of the cells associated with BL1 to be charged. Once the bit line is charged, the common source control circuit 68 outputs the control signal ($V_{cs}$) to go low (e.g., at time $t_2$) which causes the NMOS transistor 66 of the present example to substantially turn off, thereby electrically isolating the common source 64 from $V_{ss}$ (e.g., floating the common source), for example, as illustrated in FIG. 6.

Once the common source is isolated from the predetermined potential, the source terminal associated with the selected memory cell (cell 73 of FIG. 6) tends to stay at the predetermined voltage for a period of time due to the common source capacitance 75 of all the cells within the array portion 50 which are coupled together. That is, once the common source 64 is floated, the common source capacitance 75 will cause the source terminal 80 of the selected cell 73 to generally maintain its potential level, and will slowly begin to charge toward the bit line voltage. During the time in which the source terminal potential is still generally about the predetermined voltage (e.g., $V_{ss}$), the programming voltage (e.g., 9V) is coupled to the proper word line WL1 and the selected memory cell 80 is programmed. Since the source terminal of the cell 73 will tend to increase toward the bit line voltage (due to charging of the common source capacitance), it is desirable that the time period between $t_2$ and $t_3$ be sufficiently small to ensure effective programming of the cell.

Figure 7:
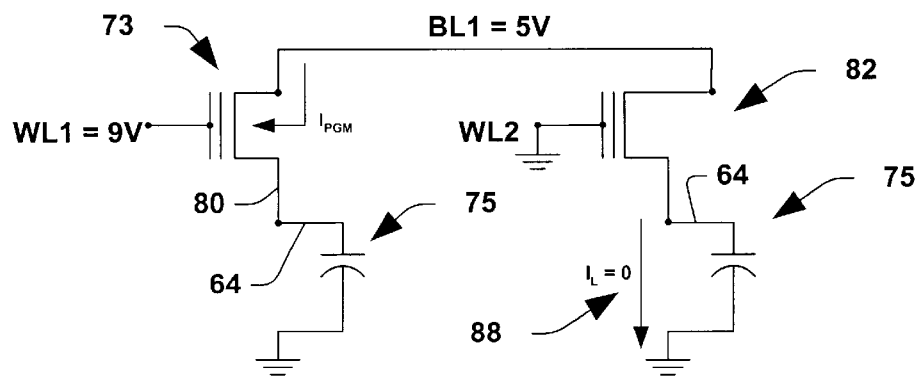
FIG. 7 is a schematic diagram illustrating the NOR-type flash memory array of the present invention, wherein a non-selected memory cell associated with the activated bit line during programming does not experience leakage due to removal of the leakage path.

Concurrently with the programming of the selected cell, the unselected cells 25 84, 86 and 88 associated with the activated bit line BL1 have their word lines grounded and have their leakage path 88 removed due to the floating of the common source 64, and thus when programming occurs, hot carrier induced leakage of the unselected cells is reduced or eliminated ($I_L$=0), as illustrated in FIG. 7.

In the above example, an NMOS transistor was employed as the common source selection component 66, and the NMOS transistor was deactivated (thus floating the common source) when the control signal 72 ($V_{cs}$) went low. Alternatively, the common source selection component 66 may comprise other types of transistors, switching components or circuits, or any activatable structure operable to cause the common source 64 to float or see a high impedance under program mode conditions, and such alternatives are contemplated as falling within the scope of the present invention. In addition, while FIGS. 4 and 6 illustrate one exemplary NOR type array architecture, it should be understood that various other types of array configurations may be considered NOR type arrays in which a plurality of the cells therein share a common source terminal, and all such array configurations are contemplated as falling within the scope of the present invention.

As seen from the above, the present invention improves the program efficiency of the memory device by eliminating or substantially reducing hot carrier induced leakage of non-selected cells on an activated bit line during programming. Another advantage of the present invention is the program uniformity, thereby providing a tight programmed threshold voltage (Vt) distribution across the NOR array portion which shares the common source. In conventional NOR-type arrays, an amount of programming of a selected cell was a function of the source resistance of the cell, which varies from cell to cell due, in part, to the layout of the array and individual device variations. Such variations in the amount of programming caused conventional array to exhibit undesirably variations in the programmed cell threshold voltages.

The present invention substantially improves program uniformity by floating the common source during programming because each cell during the program mode sees the same large impedance and the same common source capacitance, which is the shared capacitance of all the cells in that array. Thus each cell will, upon programming, program substantially the same amount, resulting in a programmed cell Vt distribution which is advantageously extremely tight.

Figure 8:
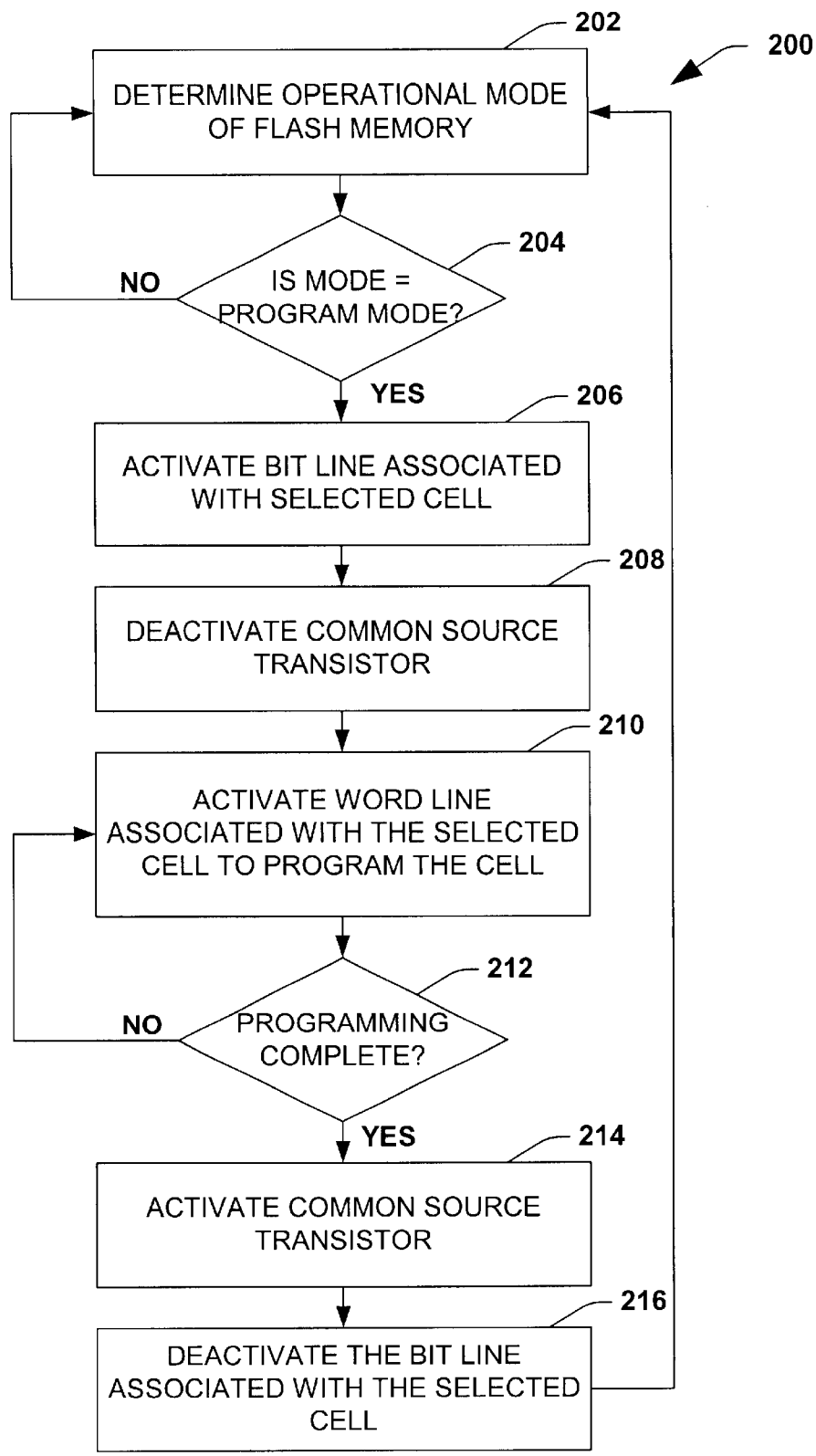
FIG. 8 is a flow chart diagram illustrating a method of programming a cell in a NOR-type flash memory circuit architecture in accordance with yet another aspect of the present invention.

According to another aspect of the present invention, a method 200 of programming a selected flash memory cell in a NOR-type flash memory device architecture is provided, as illustrated in FIG. 8. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the apparatus and systems illustrated and described herein as well as in association with other systems not illustrated.

Turning to FIG. 8, the method 200 begins at 202 with a determination of an operational mode of the flash memory device. For example, such determinations may include receiving one or more input signals associated with a desired operational mode of the device. If the determination at 204 is that the mode is not a program mode of operation (NO), the method 200 returns to 202. If, however, the determination at 204 is that the mode of operation is the program mode (YES), the bit line associated with the selected cell for programming in the NOR array is activated at 206. For example, the bit line associated with the selected cell may have a voltage applied thereto of about 5V, which thus means that each of the cells associated with that bit line has the 5V potential applied to their respective drain terminal.

The method 200 continues at 208, wherein a common source of the NOR array is floated. For example, in one aspect of the present invention, the common source is floated by deactivating a switching component such as a transistor which couples the common source to a predetermined potential such as $V_{ss}$. The word line associated with the selected cell in the NOR array is then activated at 210 after the common source has been floated, in order to program the selected cell. Concurrently, in one example, the remaining word lines in the array are coupled to a predetermined potential such as circuit ground. Once programming is complete at 212 (YES) the word line programming voltage is removed; the common source is then recoupled to the predetermined potential at 214 and the previously activated bit line is deactivated at 216.

In accordance with the present invention, the method 200 reduces or eliminates altogether hot carrier induced channel leakage associated with non-selected cells on the same bit line as the selected cell by floating the common source associated therewith during the programming operation. Since the common source is floated, the resistive leakage path of non-selected cells is eliminated, thereby greatly increasing the source impedance of the non-selected cells. Since a common source capacitance of the cells exists, a virtual ground exists momentarily on the source terminal of the selected cell, and such virtual ground potential condition exists long enough for the program operation to complete successfully. Since the hot carrier induced leakage current is reduced or eliminated, the program efficiency of the device is improved, thereby reducing wasted power consumption.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A flash memory device, comprising:
   a plurality of flash memory cells arranged in a NOR type configuration, wherein the flash memory cells are arranged in rows and columns corresponding to word lines and bit lines, respectively, and wherein each of the plurality of flash memory cells have a source terminal coupled together to form a common source; and
   a common source selection component coupled between the common source and a predetermined potential, wherein the common source selection component is operable to couple the common source to the predetermined potential in a first state and electrically isolate the common source from the predetermined potential in a second state.

2. The flash memory device of claim 1, further comprising a common source control circuit operable to receive one or more input signals indicative of a mode of operation and output a control signal to the common source selection component based on the one or more input signals.

3. The flash memory device of claim 2, wherein the common source control circuit is further operable to output the control signal to force the common source selection component to the second state when the one or more input signals indicate a program mode, thereby electrically isolating the common source from the predetermined potential.

4. The flash memory device of claim 2, wherein the one or more control signals comprise a program mode signal, a read mode signal, and an erase mode signal.

5. The flash memory device of claim 1, wherein the common source selection component comprises a transistor which is substantially on in the first state and substantially off in the second state.

6. The flash memory device of claim 5, wherein the transistor comprises an NMOS transistor operable to substantially turn on when the control signal is high and substantially turn off when the control signal is low.

7. The flash memory device of claim 1, wherein the predetermined voltage potential comprises a circuit ground potential.

8. A flash memory device, comprising:
a plurality of bit lines, wherein each of the bits lines comprise a plurality of flash memory cells having a drain terminal coupled to its respective bit line, and a source terminal coupled together to form a common source;
a plurality of word lines, wherein each of the word lines traverse the bit lines, and couple to a control gate terminal of flash memory cells associated with the traversed bit lines, respectively;
a common source selection component coupled between the common source and a predetermined potential, wherein the common source selection component is operable to couple the common source to the predetermined potential in a first state and electrically isolate the common source from the predetermined potential in a second state.

9. The flash memory device of claim 8, further comprising a common source control circuit operable to receive one or more input signals indicative of a mode of operation and output a control signal to the common source selection component based on the one or more input signals.

10. The flash memory device of claim 9, wherein the common source control circuit is further operable to output the control signal to force the common source selection component to the second state when the one or more input signals indicate a program mode, thereby electrically isolating the common source from the predetermined potential.

11. The flash memory device of claim 9, wherein the one or more control signals comprise a program mode signal, a read mode signal, and an erase mode signal.

12. The flash memory device of claim 8, wherein the common source selection component comprises a transistor which is substantially on in the first state and substantially off in the second state.

13. The flash memory device of claim 12, wherein the transistor comprises an NMOS transistor operable to substantially turn on when the control signal is high and substantially turn off when the control signal is low.

14. The flash memory device of claim 8, wherein the predetermined voltage potential comprises a circuit ground potential.

15. A flash memory device, comprising:
a plurality of flash memory cells arranged in a NOR type configuration, wherein the flash memory cells are arranged in rows and columns corresponding to word lines and bit lines, respectively, and wherein each of the plurality of flash memory cells have a source terminal coupled together to form a common source; and means for electrically isolating the common source from a predetermined potential based on a mode of operation of the flash memory device.

16. The flash memory device of claim 15, wherein the mode of the operation comprises a program mode.

17. The flash memory device of claim 15, wherein the electrically isolating means comprises means for disconnecting the predetermined potential from the common source, thereby causing the common source to float.

18. A method of programming a selected flash memory cell in a NOR-type flash memory device architecture, the device having a plurality of flash memory cells organized in a NOR-type array and each of the plurality of flash memory cells having a source terminal coupled together to form a common source, comprising:
causing the common source to float during a program mode of operation; and
programming the selected flash memory cell while the common source is floating.

19. The method of claim 18, further comprising:
determining whether a mode of operation is the program mode, a read mode or an erase mode; and
proceeding to the floating of the common source if the operation mode is determined to be the program mode.

20. The method of claim 18, wherein causing the common source to float comprises electrically decoupling the common source from a predetermined potential.

21. The method of claim 20, wherein electrically decoupling the common source from the predetermined potential comprises turning off a transistor connected between the common source and the predetermined potential during the program mode of operation.

22. The method of claim 21, further comprising:
generating a control signal based on the determination of the mode of operation; and
inputting the control signal to a control terminal of the transistor, wherein the control signal is operable to deactivate the transistor when the mode of operation is determined to be the program mode.

23. A method of programming flash memory cells within a NOR-type flash memory device architecture, wherein a plurality of flash memory cells within the device have a source terminal coupled together to form a common source, comprising:
determining an operational mode of the flash memory device;
identifying a flash memory cells within the plurality of flash memory cells as a selected cell for programming if the operational mode is determined to be a program mode;
activating a bit line associated with the selected cell;
floating the common source;
activating a word line associated with the selected memory cell with a programming voltage after floating the common source, thereby programming the selected memory cell.

24. The method of claim 23, further comprising:
removing the programming voltage from the word line associated with the selected memory cell after the selected memory cell has been programmed;
coupling the common source to a predetermined potential; and
deactivating the activated bit line.

25. The method of claim 23, wherein determining the operational mode of the flash memory device comprises:

receiving one or more signals indicative of the operational mode; and determining the operational mode based on a state of the one or more signals.

26. The method of claim 25, further comprising generating a control signal if the operational mode is determined to be the program mode.

27. The method of claim 26, further comprising using the control signal to float the common source during the program mode.

28. The method of claim 27, further comprising:

placing a transistor between the common source and a predetermined potential; and using the control signal to turn off the transistor during the program mode.

29. The method of claim 23, wherein activating the bit line comprises coupling a bit line voltage to the bit line associated with the selected flash memory cell.

30. The method of claim 23, wherein floating the common source comprises electrically decoupling the common source from a predetermined potential.

31. The method of claim 23, wherein activating the word line comprises coupling the programming voltage thereto for a predetermined period of time.

32. The method of claim 23, wherein determining the operational mode and identifying the selected cell in the program mode comprises initiating a program mode control sequence, wherein the activating of the bit line occurs a predetermined period of time before the activating of the word line to ensure that the bit line is sufficiently charged during programming.

33. The method of claim 32, wherein the program mode control sequence further dictates that the floating of the common source occurs before the activation of the word line to prevent leakage associated with one or more unselected flash memory cells associated with the activated bit line during programming of the selected memory cell.

* * * * *

UNITED STATES PATENT AND TRADEMARK OFFICE
CERTIFICATE OF CORRECTION

PATENT NO.      : 6,570,787 B1
DATED           : May 27, 2003
INVENTOR(S)     : Zhigang Wang, Nian Yang and Xin Guo It is certified that error appears in the above-identified patent and that said Letters Patent is hereby corrected as shown below:

<u>Column 6,</u>
Line 53, please delete the number "25" after the word "cells".

Signed and Sealed this

Fifteenth Day of July, 2003

JAMES E. ROGAN
*Director of the United States Patent and Trademark Office*